United States Patent
Kämäräinen

(10) Patent No.: US 9,159,849 B2
(45) Date of Patent: Oct. 13, 2015

(54) SEMICONDUCTOR DETECTOR HEAD AND A METHOD FOR MANUFACTURING THE SAME

(71) Applicant: Oxford Instruments Analytical Oy, Espoo (FI)

(72) Inventor: Veikko Kämäräinen, Helsinki (FI)

(73) Assignee: Oxford Instruments Analytical Oy, Espoo (FI)

( * ) Notice: Subject to any disclaimer, the term of this patent is extended or adjusted under 35 U.S.C. 154(b) by 7 days.

(21) Appl. No.: 13/901,610

(22) Filed: May 24, 2013

(65) Prior Publication Data

US 2014/0346630 A1    Nov. 27, 2014

(51) Int. Cl.
*H01L 31/02* (2006.01)
*H01L 31/0203* (2014.01)
*H01L 31/18* (2006.01)
*H01L 31/024* (2014.01)

(52) U.S. Cl.
CPC .......... *H01L 31/0203* (2013.01); *H01L 31/024* (2013.01); *H01L 31/02005* (2013.01); *H01L 31/18* (2013.01)

(58) Field of Classification Search
CPC ............ H01L 31/02005; H01L 31/024; H01L 31/018
USPC ........... 257/433, E23.114, E23.115; 250/336, 250/336.1–395
See application file for complete search history.

(56) References Cited

U.S. PATENT DOCUMENTS

| | | | |
|---|---|---|---|
| 2004/0256568 A1* | 12/2004 | Sekine et al. | 250/370.11 |
| 2007/0176110 A1* | 8/2007 | Yokoi et al. | 250/370.09 |
| 2011/0139987 A1* | 6/2011 | Kromer | 250/336.1 |
| 2012/0228498 A1 | 9/2012 | Scheid et al. | |

FOREIGN PATENT DOCUMENTS

JP    2012242927 A  * 11/2012
JP    2014092448 A  *  5/2014

* cited by examiner

*Primary Examiner* — Marc Armand
*Assistant Examiner* — Quinton Brasfield
(74) *Attorney, Agent, or Firm* — Harrington & Smith

(57) ABSTRACT

A semiconductor detector head comprises a detector chip having a front side and a back side, and a substrate on the back side of said detector chip. Contact points are located on at least one of said substrate and said detector chip. A first set of contact pins protrude on an opposite side of said substrate than said detector chip. At least one of the contact pins of said first set is conductively coupled to at least one of said contact points. A base plate holds a second set of contact pins that protrude from said base plate towards the contact pins of said first set. Electric connections are made between matching pairs of contact pins of said first and second sets.

15 Claims, 2 Drawing Sheets

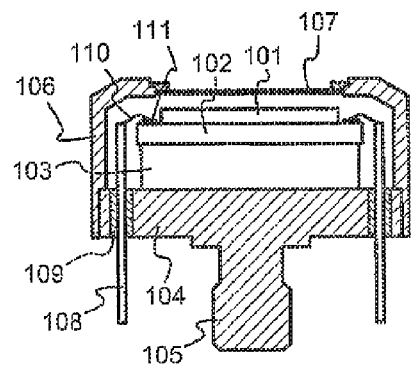
Fig. 1: PRIOR ART
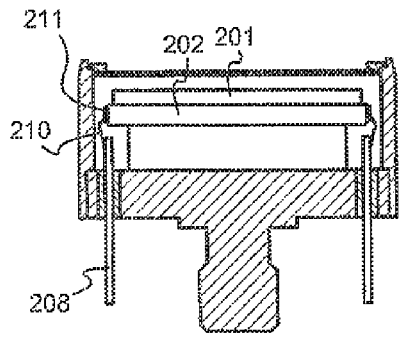
Fig. 2: PRIOR ART
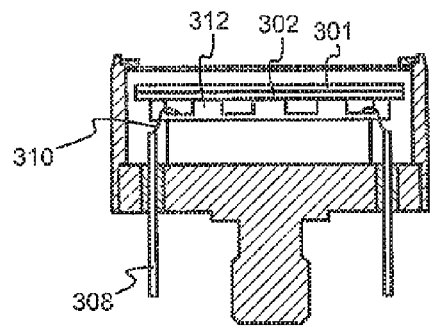
Fig. 3: PRIOR ART
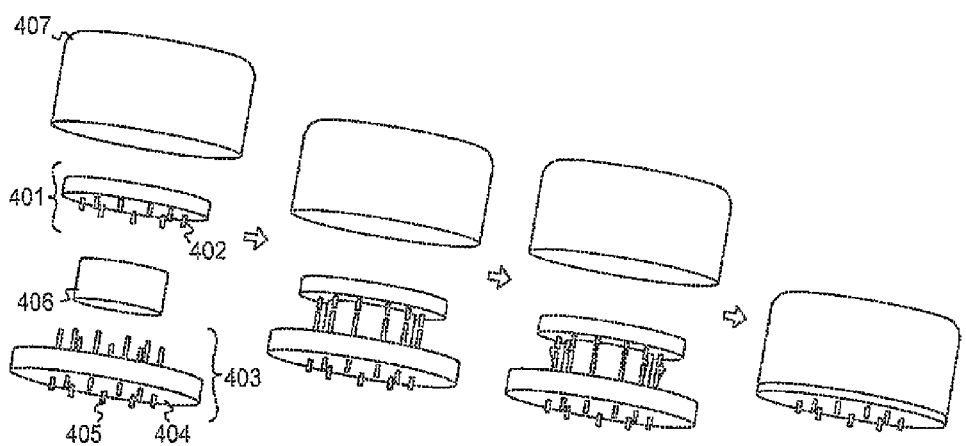
Fig. 4

SEMICONDUCTOR DETECTOR HEAD AND A METHOD FOR MANUFACTURING THE SAME

TECHNICAL FIELD

This invention is related to the general technical field of semiconductor radiation detectors. Especially the invention is related to such semiconductor radiation detectors that are enclosed in hermetically sealed covers or enclosures.

BACKGROUND OF THE INVENTION

Effective operation of certain semiconductor radiation detectors, such as PIN diode (p-type—intrinsic—n-type) detectors and SDDs (silicon drift detectors), benefits from sealing the detector crystal and its immediate electric contacts in a gas-tight enclosure known as the detector can. A radiation window at the front face of the detector can allows radiation to enter, while the back side of the can has the attachment means and contact pins that are needed to couple the detector mechanically, electrically, and thermally to the radiation-detecting appliance. A thermoelectric cooler, such as a Peltier element, is typically included in the entity, which in assembled form is frequently referred to as the detector head.

FIG. 1 illustrates a prior art detector head. The detector chip 101 or is attached to a substrate 102, which in turn is attached to a thermoelectric cooler 103. A base plate 104 with an protruding attachment bolt 106 supports the arrangement and closes the bottom of the detector can 106, the front face of which has an opening covered by a radiation window 107. The graphical illustration is simplified and omits possible intermediate shielding layers and other features that are not essential for understanding the background of the present invention.

Contact pins 108 go through holes in the base plate 104, and are electrically isolated therefrom by insulator sleeves 109. The entity that consists of the base plate 104, the attachment bolt 105, the contact pins 108, and the insulator sleeves 109 is sometimes called the header. A bonding wire 110 connects the top end of each contact pin 108 to a bonding pad 111 on the top surface of the substrate 102. Further bonding wires (not shown) may constitute the electric connections between areas of the substrate 102 and respective contact pads on the detector chip 101.

The sensitivity of the detector is in principle the better, the larger is the detector chip: the larger surface of the detector chip collects more photons, increasing the pulse frequency. In the arrangement of FIG. 1 the substrate 102, and thus also the detector chip 101, must be smaller in diameter than the circle formed by the contact pins 108, because the bonding wedge must be able to touch the top ends of the contact pins, as well as the bonding pads on the substrate 102 and detector chip 101, from above. Basically it would be possible to make the whole detector head larger in diameter, but that would make it more difficult to place it close to the sample from which originates the radiation to be detected. The diameter of the ring of contact pins must always be significantly smaller than the diameter of the base plate, because hermetically sealing and electrically insulating the contact pin holes in the base plate necessitate the use of an insulator sleeve that completely encircles the contact pin and has a certain minimum wall thickness.

FIGS. 2 and 3 illustrate known detector heads that aim at avoiding the size-limiting effect of the circle of contact pins. The structure of FIG. 2 is known from the patent publication EP 2286275. The bonding is made from the side, so the bonding wire 210 connects the side surface of the contact pin 208 to a bonding pad 211 located on a vertical surface of the substrate 202. In this arrangement the contact pins are shorter than in the arrangement of FIG. 1, and the upper limit for the diameter of the substrate 202 (and consequently, to almost the same extent, for the diameter of the detector chip 201) is determined by the diameter of the circle of contact pins plus the marginal difference allowed by the bonding. In practice one may say that it is the diameter of the circle of contact pins that defines the maximum diameter of the substrate.

The structure of FIG. 3 is known from the patent publication US 2012/0228498, The detector chip 301 is flip-chip-bonded to a first substrate 302, under which is a second substrate 312, the outer edge of which defines cavities. For connections to the contact pins, bonding wires 310 go between the top ends of the contact pins 308 and bonding pads (not separately shown) located in said cavities. Bonding to the top side of the detector chip 301 is typically also needed, although not shown in FIG. 3. The diameter of the second substrate 312 must be smaller than that of the circle of contact pins, but the diameter of the first substrate 302 and the detector chip 301 can be of the same size or even larger than the diameter of the circle of contact pins.

A need exists for detector head structures that would enable the detector chip to have a large area while simultaneously making the structure easy to manufacture and reliable in use. For example the solution shown in FIG. 2 still has the limitation that the substrate (and therefore also the detector chip) cannot be substantially larger than the circle of contact pins. The structure of FIG. 3 requires flip-chip bonding of the detector chip, which requires special equipment in manufacturing and may lead to lower yield due to difficulties in the manufacturing process.

SUMMARY OF THE INVENTION

The following presents a simplified summary in order to provide a basic understanding of some aspects of various invention embodiments. The summary is not an extensive overview of the invention. it is neither intended to identify key or critical elements of the invention nor to delineate the scope of the invention.

The following summary merely presents some concepts of the invention in a simplified form as a prelude to a more detailed description of exemplifying embodiments of the invention.

In accordance with a first aspect of the invention, there is provided a detector head that comprises:
  a detector chip having a front side and a back side,
  a substrate on the back side of said detector chip,
  contact points on at least one of said substrate and said detector chip,
  a first set of protruding contact pins on an opposite side of said substrate than said detector chip, wherein at least one of the contact pins of said first set is conductively coupled to at least one of said contact points,
  a base plate.
  a second set of contact pins protruding from said base plate towards the contact pins of said first set, and
  electric connections between matching pairs of contact pins of said first and second sets.

In accordance with a second aspect of the invention, there is provided a method for manufacturing a detector head so that the method comprises:
  attaching a substrate to a back side of a detector chip, electrically connecting contact points that are located on at least one of said substrate and said detector chip to a first set of protruding contact pins that are located on an opposite side of said substrate than said detector chip, and electrically connecting contact pins of said first set to contacts pins of a second set that protrude from a base plate towards the contact pins of said first set.

According to an objective of the present invention, the detector chip should occupy as much as possible of the available space in the front part of a detector head. According to another objective of the present invention, the connections to and from the detector chip should be made in a way that enables simple and reliable manufacturing and operation.

These and further objectives and advantages of the invention are achieved by using two sets of contact pins. The so-called first or upper set of contact pins, which may also comprise contact studs, is first integrated with the detector chip and its substrate. Connections between the contact pins or studs and relevant parts of the integrated assembly may be made utilizing any side or even both sides of the assembly. A separate carrier may be used, to which the contact pins of the first sets are attached. The first set of contact pins or studs is aligned with the so-called second or lower set of contact pins that constitute a part of a header that supports the whole detector head and may act as a lid that closes the lower end of a detector can, if one is used. Connections between contact pins of the first and second sets can be made by suitable means, including but not being limited to bonding, gluing, soldering, and welding.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF DRAWINGS

FIG. 1 illustrates a detector head according to prior art,

FIG. 2 illustrates another detector head according to prior art,

FIG. 3 illustrates another detector head according to prior art,

FIG. 4 illustrates a method for manufacturing a semiconductor detector head according to an embodiment of the invention.

DETAILED DESCRIPTION OF EMBODIMENTS OF THE INVENTION

Figures 5, 6, 7, 8:
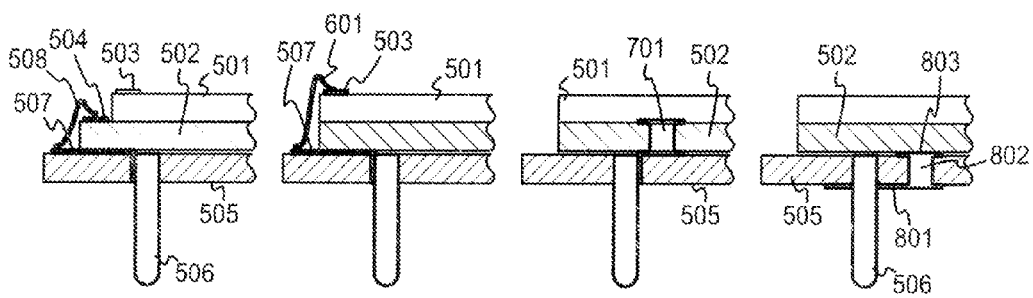
FIGS. 5-12 illustrate details of semiconductor heads according to embodiments of the invention.

FIG. 4 is a simplified schematic illustration of manufacturing a semiconductor detector head according to an embodiment of the invention. A first entity 401 comprises at least a detector chip and a substrate, which are not separately shown in FIG. 4. Advantageous ways of constructing the first entity, and especially the possibility of including a carrier in addition to the detector chip and the substrate, are discussed in more detail later.

The first entity 401 comprises also a first set of contact pins 402. The purpose of the contact pins is to provide means for making electrical connections to desired parts of the first entity 401. At least one of the contact pins is conductively coupled to at least one contact point that is located on the substrate or on the detector chip.

A second entity 403 comprises a base plate 404 and a second set of contact pins 405 that protrude from the base plate on that side that faces the first entity 401. The contact pins of the second set may go through the base plate 404 so that their ends are accessible on its other (lower) side. Also other possibilities exist for making electric connections between contact pins of the second set and any further electric parts of a measurement apparatus. If the base plate 404 is made of—or otherwise comprises—electrically conductive material, insulator sleeves or other suitable kind of electric isolation must be used to keep the contact pins of the second set from being short-circuited through the base plate.

A thermoelectric cooler 406 may be provided: advantageously it is located between the first and second entities 401 and 403. Structural details that have little significance to the embodiments discussed here are not shown. For example, a centrally located attachment bolt or other kind of mechanical attachment means may appear as a part of the base plate 404 or in close association with it.

The second step from the left shows how the first and second entities are brought together so that the thermoelectric cooler is sandwiched between them. The contact pins of the first and second sets form matching pairs, so that in each matching pair the corresponding ends of the contact pins come close to or into contact with each other, The third step from the left shows how electric connections are made between matching pairs of contact pins of said first and second sets. The manufacturing method may comprise attaching the thermoelectric cooler to the base plate before the step of electrically connecting the contact pins of the first set to contact pins of the second set.

In the fourth step a cover, which here takes the form of a detector can 407, is placed over the whole assembly and attached to the base plate. Together with the base plate, the detector can 407 forms a hermetically sealed enclosure that encloses the detector chip, the substrate, the first set of protruding contact pins, that part of the second set of contact pins that protrudes from the base plate towards the contact pins of the first set, and the electric connections between matching pairs of contact pins of the first and second sets. A radiation window (not separately shown) in the detector can allows radiation to reach the detector chip.

It is not necessary to enclose the detector head in a detector can or to cover it in any way. Measurement arrangements exist where the semiconductor radiation detector may remain exposed. Such arrangements frequently involve a chamber, in which both the sample to be measured and the detector head are located, so that pumping a vacuum in the chamber or otherwise affecting the gaseous atmosphere inside the chamber provides the required advantageous environmental conditions.

The contact pins of the first set may be attached directly to the substrate, so that they protrude to an opposite direction from the substrate than the detector chip. However, in many cases it is more advantageous to use a separate carrier, to which the contact pins of the first set are attached, A separate carrier may serve as an additional mechanical support, and it may give more possibilities for designing the conductive tracks, bonding pads, and/or other kinds of electric connections.

FIGS. 5 to 12 illustrate some details of embodiments where such a carrier is used. These details do not constitute any exhaustive list of possible implementations; they are not exclusive alternatives of each other: and any of them can be used in any combination with any other features and embodiments of the invention. Concerning the task of making connections to the detector chip it should be noted that an SDD chip frequently requires making connections by bonding to its both sides. A PIN diode as a detector element may have e.g. bonded connections to its top side and a single contact on the bottom side that is made with conductive glue.

FIG. 5 is a partial cross section of a part of a semiconductor detector head. The topmost layer in the stack of layers is a detector chip 501, which has a front side (facing upwards in FIG. 5) and a back side. A substrate 502 is located on the back side of the detector chip. Contact points exist on the substrate 502 and/or on the detector chip 501 for making electric connections; in FIG. 5 examples of contact points appear as contact pads 503 and 504 on the detector chip and the substrate respectively.

As a further layer of what would be the first entity in the vocabulary used above to describe FIG. 4, the semiconductor detector head of FIG. 5 comprises a carrier 505. The carrier is located on the opposite side of the substrate 502 than the detector chip 501. The surfaces of the carrier can be referred to by saying that the carrier 505 has a front side that faces the substrate 502, and a back side, which in FIG. 5 is downwards.

A contact pin 506 is seen in FIG. 5. The contact pin 506 is one of a first set of protruding contact pins located on an opposite side of the substrate 502 than the detector chip 501. In particular the contact pin 506—as well as other contact pins of the first set—are attached to the carrier 505 and protrude out of its back side. The contact pin 506 reaches at least partly through the carrier 505; here its top end is essentially flush with the front side of the carrier.

At least one of the contact pins of said first set is conductively coupled to at least one of the contact points that are located on the detector chip 501 and/or the substrate 502. FIG. 5 illustrates one way of making such a conductive coupling. The carrier 505 comprises at least one conductive area on its surface. in the embodiment of FIG. 5 this is a conductive area 507 on the front surface of the carrier 505. It is conductively coupled to the contact pin 506 at (or close to the point where the proximal end of the contact pin 506 comes through the carrier 505. In the illustration of FIG. 5 the conductive area continues as a metallization on a wall of the hole in which the contact pin 506 is installed.

The diameter of the carrier 505 is slightly larger than the diameter of any of the substrate 502 and the detector chip, leaving some of the carrier visible when looked from above. This way at least a part of the conductive area 507 is exposed and accessible. A conductive coupling is made between the conductive area 507 and the contact point 504 on the exposed surface of the substrate 502. In the embodiment of FIG. 5 this conductive coupling appears in the form of a bonding wire 508.

FIG. 6 illustrates an embodiment in which a bonding wire 601 implements a conductive coupling between the conductive area 507 and the contact point 503 on the detector chip. If no similar bonded connections need to be made to any contact points at the edge of the substrate, the detector chip does not need to leave any exposed regions at the edge of the substrate. Therefore the diameter of the detector chip 501 is the same as that of the substrate in the embodiment of FIG. 6. It is also possible to combine the techniques illustrated in FIGS. 5 and 6: at some parts the bonding from a conductive area on the carrier may go to the substrate while at others it may go directly to the detector chip. Such a combination may be facilitated by forming the outer edge of the substrate and detector chip differently, so that at some parts the substrate surface is exposed while at others it is not.

The substrate of a detector chip may have some features known from printed circuit boards, such as so-called plated vias that constitute a conductive coupling right through the substrate. FIG. 7 illustrates an embodiment in which the substrate 502 comprises a plated via. The material of the substrate 502 defines an opening 701, walls of which are at least partially plated with metal or other conductive substance. The plating continues to some extent to the upper and lower sides of the substrate, where electrical connections are made to a conductive area on the front surface of the carrier on one hand and to an electrode on the back surface of the detector chip on the other hand.

The plated via technique can be used to make electric connections through the carrier. FIG. 8 illustrates en embodiment in which the carrier 505 comprises a conductive area 801 on its back surface. The conductive area 801 is conductively coupled to the contact pin 506 at or close to the point where the protruding portion of the contact pin 506 meets the back surface of the carrier 505. The carrier defines an opening 802, and the substrate 502 comprises an electrical contact 803 that at least partly overlaps with the opening 802. The conductive area 801 and said electrical contact 803 are conductively coupled to each other through the opening 802. in this embodiment such conductive coupling is made through a conductive plating along at least a part of the edge of the opening 802, so the opening 802 constitutes a plated via through the carrier 505.

Figures 9, 10, 11, 12:
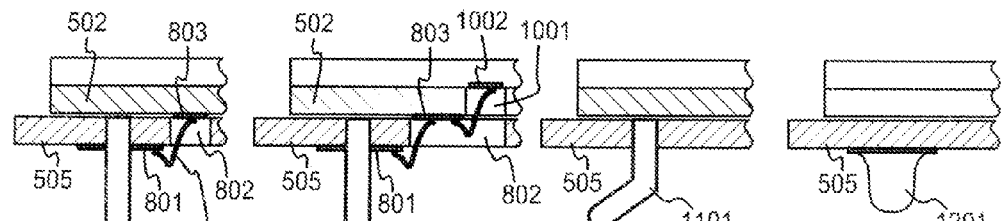

FIG. 9 illustrates an embodiment that has some of the same features as that illustrated in FIG. 8. The conductive area 801 on the back surface of the carrier 505 is conductively coupled to the contact pin 506 at or close to the point where the protruding portion of the contact pin 506 meets the back surface of the carrier 505. The carrier also defines an opening 802, and the substrate 502 comprises an electrical contact 803 that at least partly overlaps with the opening 802. The conductive area 801 and said electrical contact 803 are conductively coupled to each other through the opening 802, but in this embodiment the conductive coupling takes the form of a bonding wire 901. Bonding from below is possible during the manufacturing method if the semiconductor detector head is assembled in stages. At the time when the bonding wire 901 is put into place, the first entity that comprises the detector chip, the substrate, and the carrier has been assembled but it has not yet been attached to the second entity that comprises the base plate and the thermoelectric cooler.

FIG. 10 illustrates an embodiment where the substrate 502 defines a further opening 1001 that at least partly overlaps the opening 802 in the carrier. A conductive coupling exists to an electrode 1002 on the back surface of the detector chip through said further opening 1001. in particular, the conductive area 801 on the back surface of the carrier 605 is bonded to an electrical contact 803 on the substrate, from which a further bonding wire goes through the further opening 1001 to the electrode 1002. If the dimensions allow, a bonding wire could go even from the conductive area 801 on the back surface of the carrier 505 directly to the electrode 1002, through both openings 802 and 1001.

The invention does not require that the contact pins of the first set should be straight pins that protrude perpendicularly out of the back surface of the carrier (or the substrate, if no separate carrier is used). Straight pins that protrude obliquely out of the back side of the carrier could be used. FIG. 11 illustrates a further alternative that comprises curved contact pins 1101 that protrude out of the back surface of the carrier 505. FIG. 12 illustrates another further alternative in which the contact pins of the first set comprise a stud 1201 that protrudes out of the back side of the carrier 505.

Figure 13:
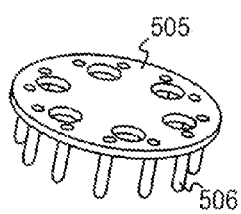
FIG. 13 illustrates a carrier for use in a semiconductor head according to an embodiment of the invention.
Figure 14:
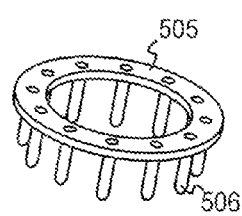
FIG. 14 illustrates another carrier for use in a semiconductor head according to an embodiment of the invention.

Various alternatives are possible concerning the number, location, shape, and use of openings (if any) in the carrier. FIG. 13 illustrates a planar carrier 505. out of the back side of which the contact pins 506 of the first set protrude. In this embodiment the carrier 505 defines half as many openings as there are contact pins in the first set, and each opening is located roughly between two contact pins. FIG. 14 illustrates a carrier 505, which has a generally annular form so that it defines only one large opening in the center. Such a large central opening can be used for all bonding and other connections to the substrate, but also to allow the thermoelectric cooler or other centrally located component to extend through the carrier and touch directly (or indirectly through some radiation barriers, glue, or other intermediate layers, if needed) the substrate of the detector chip.

Figures 15, 16, 17:
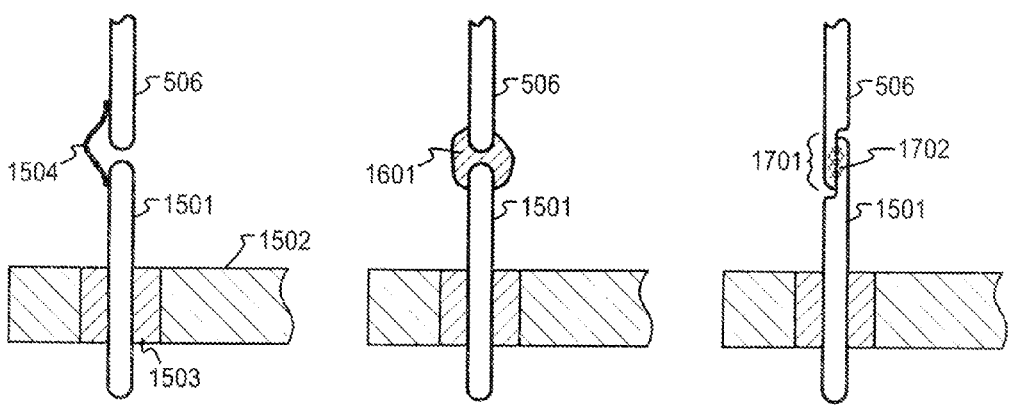
FIGS. 15-17 illustrate details of making electrical connections between contact pins in semiconductor heads according to embodiments of the invention.

FIGS. 15 to 17 introduce some examples of how to make the electric connections between matching pairs of contact pins of the first and second sets. A contact pin 1501 of the second set is shown as being installed to a base plate 1502 through an electrically insulating sleeve 1503. One end (the lower end in FIG. 15) of the contact pin 1501 protrudes out of the semiconductor detector head for electrically coupling parts of the semiconductor detector head with appropriate electric circuits of the radiation detection apparatus. The other end of the contact pin 1501 protrudes inwards from the base plate 1502, and is located close to the protruding end of a contact pin 506 of the first set, so that these two form a matching pair. A bonding wire 1504 is bonded to the side surfaces of the pins 506 and 1501 of the first and second sets respectively. Bonding from the side is possible, because there is free space on the outer side of the semiconductor detector head before it is enclosed into the detector can.

FIG. 16 illustrates an alternative embodiment in which the electric connection between a matching pair of contact pins 506 and 1501 of the first and second sets comprises glue 1601, which in this case is electrically conductive glue. If the contact pins are in direct contact with each other and the glue is only used to hold them in place, also non-conductive glue could be used. The use of a bonding wire and glue can also be combined so that the bonding wire implements the electric connection and the glue holds the bonding wire in place.

FIG. 17 illustrates an alternative embodiment in which the electric connection between a matching pair of contact pins 506 and 1501 of the first and second sets comprises a joining section 1701, at which the forms of the matching portions of the two contact pins are such that they meet each other and ensure good and reliable electric connection. The joining section may also comprise a weld 1702 or other way of enforcing the mechanic and electric connection.

The techniques illustrated in FIGS. 16 and 17 for making the electric connection between a matching pair of contact pins involve a much larger thermal conductivity between the pair of contact pins than in solutions that use a bonding wire. This may make these techniques unusable or at least disadvantageous in solutions where thermal conductivity should be kept small as possible, for example in order to keep the detector chip as effectively cooled as possible.

A method for manufacturing a semiconductor detector head according to an embodiment of the invention comprises attaching a substrate to a back side of a detector chip, and electrically connecting contact points that are located on the substrate and/or the detector chip to a first set of protruding contact pins. These are located on an opposite side of said substrate than said detector chip. The method comprises also electrically connecting contact pins of said first set to contacts pins of a second set that protrude from a base plate towards the contact pins of said first set. The method may comprise attaching a carrier to a different surface of the substrate than said detector chip, to which carrier the contact pins of said first set are attached.

if a thermoelectric cooler is used, the method may comprise attaching the thermoelectric cooler to the base plate before the step where contact pins of the first set are electrically connected to contact pins of the second set. This way two entities are formed for the assembling phase: a first entity comprises the detector chip, the substrate, and the carrier (if one is used). A second entity comprises the base plate (with the second set of contact pins attached to it) and the said thermoelectric cooler. These two entities are attached to each other by gluing first entity to the top of the thermoelectric cooler, before the assembling proceeds to electrically connecting the contact pins of the first set to contact pins of the second set.

The step of electrically connecting the contact pins of the first set to contact pins of the second set may comprise bonding or gluing a piece of electrically conductive wire to side surfaces of a matching pair of contact pins from the first and second sets. Alternatively it may comprise gluing the matching pair of contact pins directly to each other, or welding them together at a joining section.

The use of two sets of matching contact pins enables making the detector chip large, because at least in some embodiments of the invention there is no structural part below the detector chip that should have a larger diameter than the detector chip. In some embodiments at least one of the substrate or the carrier should be slightly larger than the detector chip, because some of their edge areas should remain exposed to enable the bonding wedge or other connection-making tool to reach them from above. However, at least the diameter of the ring of contact pins does not limit the size of the detector chip in any way.

It should be noted that the contact pins need not be arranged in a circular ring, and neither do any other structural parts like the detector chip need be round in any embodiment of the invention. Therefore, when one discusses possible limitations to dimensions, the advantages of the invention are not limited to making a round detector chip larger in diameter than a ring of contact pins. More generally it can be said that due to the present invention the way in which the contact pins are arranged places very few—if any—limitations to the size and form of the structures above them in the detector head.

The invention claimed is:
1. A semiconductor detector head, comprising:
a detector chip having a front side and a back side,
a substrate on the back side of said detector chip,
contact points on at least one of said substrate and said detector chip,
a first set of protruding contact pins on an opposite side of said substrate than said detector chip, wherein at least one of the contact pins of said first set is conductively coupled to at least one of said contact points,
a base plate,
a second set of contact pins protruding from said base plate towards the contact pins of said first set, and bonded electric connections between matching pairs of contact pins of said first and second sets, said bonded electrical connections comprising bonding wires bonded to side surfaces of the respective pins of said first and second sets.

2. A semiconductor detector head according to claim 1, wherein the contact pins of said first set are attached to the substrate and protrude to an opposite direction from the substrate than the detector chip.

3. A semiconductor detector head according to claim 1, comprising a thermoelectric cooler between said base plate and said substrate.

4. A semiconductor detector head according to claim 1, comprising a cover attached to said base plate and forming, together with said base plate, a hermetically sealed enclosure that encloses the detector chip, the substrate, the first set of protruding contact pins, that part of the second set of contact pins that protrudes from said base plate towards the contact pins of said first set, and the electric connections between matching pairs of contact pins of said first and second sets.

5. A semiconductor detector head according to claim 1, wherein:
the semiconductor detector head comprises a carrier on said opposite side of said substrate than said detector chip,
said carrier has a front side facing said substrate and a back side, and
the contact pins of said first set are attached to said carrier and protrude out of its back side.

6. A semiconductor detector head according to claim 5, wherein:
the front side of said carrier comprises a conductive area that is at least partly exposed, and
the semiconductor detector head comprises a conductive coupling between said conductive area and at least one of the following: a contact point on the detector chip, a contact point on an exposed surface of the substrate.

7. A semiconductor detector head according to claim 5, wherein the contact pins of said first set comprise at least one of the following: straight pins that protrude perpendicularly out of the back side of the carrier, straight pins that protrude obliquely out of the back side of the carrier, curved pins that protrude out of the back side of the carrier, studs that protrude out of the back side of the carrier.

8. A semiconductor detector head according to claim 5, wherein:
the carrier comprises at least one conductive area on its surface, and
said conductive area is conductively coupled to at least one of said contact pins of the first set.

9. A semiconductor detector head according to claim 8, wherein:
said conductive area is on the back side of the carrier, and conductively coupled to said at least one of said contact pins of the first set at or close to the point where the contact pin separates from the carrier.

10. A semiconductor detector head according to claim 8, wherein:
said at least one of said contact pins of the first set reaches at least partly through the carrier, and
said conductive area is on the front side of the carrier and conductively coupled to said at least one of said contact pins of the first set at or close to the point where a proximal end of the contact pin comes through the carrier.

11. A semiconductor detector head according to claim 5, wherein:

the carrier comprises at least one conductive area on its back side,
the carrier defines an opening,
the substrate comprises an electrical contact that at least partly overlaps said opening, and
said conductive area and said electrical contact are conductively coupled to each other through said opening.

12. A semiconductor detector head according to claim 11, wherein the conductive coupling between said conductive area and said electrical contact comprises one of the following:
a bonding wire, a conductive plating along an edge defining said opening.

13. A semiconductor detector head according to claim 11, wherein:
the substrate defines a further opening that at least partly overlaps said opening in the carrier, and
the semiconductor detector head comprises a conductive coupling to the detector chip through said further opening.

14. A semiconductor detector head, comprising:
a detector chip having a front side and an opposed back side,
a substrate on the back side of said detector chip,
a carrier on said opposite side of said substrate than said detector chip, said carrier having a front side faceing said substrate and a back side and said carrier front side comprising a conductive area that is at least partly exposed,
contact points on at least one of said substrate and said detector chip,
a first set of protruding contact pins on an opposite side of said substrate than said detector chip attached to said carrier and protruding out of the carrier back side, wherein at least one of the contact pins of said first set is conductively coupled to at least one of said contact points,
a base plate,
a second set of contact pins protruding from said base plate towards the contact pins of said first set,
bonded electric connections between matching pairs of contact pins of said first and second sets, and
a conductive coupling between said conductive area and at least one of the following: a contact point on the detector chip a contact point on an exposed surface of the substrate.

15. A semiconductor detector head, comprising:
a detector chip having a front side and a back side,
a substrate on the back side of said detector chip,
contact points on at least one of said substrate and said detector chip,
a first set of protruding contact pins on an opposite side of said substrate than said detector chip, wherein at least one of the contact pins of said first set is conductively coupled to at least one of said contact points,
a base plate,
a second set of contact pins protruding from said base plate towards the contact pins of said first set,
electric connections between matching pairs of contact pins of said first and second sets, and
a carrier on said opposite side of said substrate than said detector chip having a front side facing said substrate and a back side, wherein:
the contact pins of said first set are attached to said carrier and protrude out of its back side,
the carrier comprises at least one conductive area on its back side, the carrier defines an opening, the substrate comprises an electrical contact that at least partly overlaps said opening, and said conductive area and said electrical contact are conductively coupled to each other through said opening.

* * * * *